(12) United States Patent
Sun et al.

(10) Patent No.: US 9,520,400 B2
(45) Date of Patent: Dec. 13, 2016

(54) NOR STRUCTURE FLASH MEMORY AND MANUFACTURING METHOD THEREOF

(71) Applicant: CSMC TECHNOLOGIES FAB1 CO., LTD., Jiangsu (CN)

(72) Inventors: Shizhen Sun, Jiangsu (CN); Hao Fang, Jiangsu (CN); Yong Gu, Jiangsu (CN)

(73) Assignee: CSMC TECHNOLOGIES FAB1 CO., LTD., Jiangsu (CN)

( * ) Notice: Subject to any disclaimer, the term of this patent is extended or adjusted under 35 U.S.C. 154(b) by 0 days.

(21) Appl. No.: 14/398,849

(22) PCT Filed: May 19, 2013

(86) PCT No.: PCT/CN2013/075422
§ 371 (c)(1),
(2) Date: Nov. 4, 2014

(87) PCT Pub. No.: WO2013/166981
PCT Pub. Date: Nov. 14, 2013

(65) Prior Publication Data
US 2015/0118838 A1    Apr. 30, 2015

(30) Foreign Application Priority Data

May 9, 2012   (CN) .......................... 2012 1 0140898

(51) Int. Cl.
*H01L 27/105* (2006.01)
*H01L 21/28* (2006.01)
(Continued)

(52) U.S. Cl.
CPC ......... *H01L 27/1052* (2013.01); *H01L 21/283* (2013.01); *H01L 21/28273* (2013.01);
(Continued)

(58) Field of Classification Search
CPC .................................................. H01L 27/1052
See application file for complete search history.

(56) References Cited

U.S. PATENT DOCUMENTS 5,502,321 A * 3/1996 Matsushita ................... 257/316
5,736,442 A * 4/1998 Mori ............................ 438/257
(Continued)

FOREIGN PATENT DOCUMENTS

| CN | 1812107 A | 8/2006 |
|---|---|---|
| CN | 101369585 A | 2/2009 |

(Continued)

OTHER PUBLICATIONS

International Search Report dated Aug. 15, 2013.

*Primary Examiner* — Yu-Hsi D Sun
(74) *Attorney, Agent, or Firm* — Polsinelli PC

(57) ABSTRACT

A NOR flash memory and its manufacturing method are provided in the present disclosure, they are in the field of flash memory. In the manufacturing method, a mask dielectric layer is formed on a second polysilicon layer of a gate stack structure. In addition, part of the mask dielectric layer is etched patternedly to expose part of the second polysilicon layer which is close to a source. Furthermore, the exposed second polysilicon layer is self aligned to form a metal silicide layer. Thus in the NOR flash memory, an unetched mask dielectric layer is substantially located between a metal silicide layer and a drain contacting hole of the NOR flash memory. A drain current between the gate electrode and the drain electrode is small, the above manufacturing method is not complex, a process window is large, a side effect is small, which are advantageous to large scale production.

16 Claims, 6 Drawing Sheets

(51) Int. Cl.
  *H01L 29/66*     (2006.01)
  *H01L 29/788*    (2006.01)
  *H01L 27/115*    (2006.01)
  *H01L 21/283*    (2006.01)
  *H01L 29/423*    (2006.01)

(52) U.S. Cl.
  CPC .. *H01L 27/11521* (2013.01); *H01L 27/11524* (2013.01); *H01L 29/42324* (2013.01); *H01L 29/66825* (2013.01); *H01L 29/7881* (2013.01)

(56) References Cited

U.S. PATENT DOCUMENTS

| | | | |
|---|---|---|---|
| 6,642,112 B1 * | 11/2003 | Lowe | H01L 21/823842 257/E21.637 |
| 2004/0065917 A1 | 4/2004 | Fan et al. | |
| 2009/0267132 A1 | 10/2009 | Cha et al. | |
| 2011/0129984 A1 * | 6/2011 | Funayama et al. | 438/424 |

FOREIGN PATENT DOCUMENTS

| | | |
|---|---|---|
| CN | 102136456 A | 7/2011 |
| EP | 1884956 A1 | 2/2008 |

* cited by examiner

NOR STRUCTURE FLASH MEMORY AND MANUFACTURING METHOD THEREOF

RELATED APPLICATIONS

This application is a United States National Stage Application filed under 35 U.S.C 371 of PCT Patent Application Serial No. PCT/CN2013/075422, filed May 9, 2013, which claims priority of Chinese Patent Application Serial No. CN/201210140898.3, filed May 9, 2012, the disclosure of all of which are hereby incorporated by reference in their entireties.

FIELD OF THE INVENTION

The present invention relates to flash memories, and more particularly relates to a NOR (EPROM Tunnel Oxide) flash memory and its manufacturing method.

BACKGROUND OF THE INVENTION

Flash memory is a common memory, which has been widely used in various kinds of digital storage devices. The flash memory usually stores information using a floating gate structure. Various kinds of flash memories are developed according to the difference of the floating structure. NOR flash memory is an important kind of flash memory. Intel has introduced ETOX™ NOR flash memory in the last century, the NOR flash memory has a large market share in the memory market.

FIG. 1 is a schematic view of a conventional NOR flash memory. Referring to FIG. 1, two NOR flash memory units, i.e. 10a and 10b of the NOR flash memory, are symmetric to each other and share a source (S), and the flash memory units 10a and 10b are symmetric. A metal silicide layer 130 is located on a floating gate, and can be used to bias a gate signal on the floating gate. 160 is a dielectric layer at least surrounding the floating gate, 140 is an ILD (interlayer dielectric) barrier layer, 150 is a drain electrode (it is usually a drain contacting hole) led out by the drain (D) of the NOR flash memory unit.

In an erasing operation of the NOR flash memory, electrons in the floating gate are erased through an F-N tunneling effect. Referring to FIG. 1, during erasing process, the metal silicide layer 130 on the floating gate is biased a 16 V or larger voltage, the drain electrode 150 is floating. The drain electrode 150 is electrical isolated from the gate electrode through the dielectric layer 160 and/or the ILD barrier layer 140 (the actual thicknesses of the dielectric layer 160 and the ILD layer 140 are much smaller than that shown in FIG. 1). When the voltage difference between the gate electrode and the drain electrode 150 is very large, a drain current shown in FIG. 1 will be induced.

The NOR flash memory continuously scales down, for example, as the critical dimension of the NOR flash memory is smaller than 0.13 µm, an isolation layer (such as the dielectric layer 160 and the ILD barrier layer 140) between the drain electrode 150 and the gate electrode become much thinner, a drain current problem during the erasing process of the gate electrode and the drain electrode 150 become much worse.

SUMMARY OF THE INVENTION

An object of the present disclosure is to decrease a drain current between the gate electrode and the drain electrode of the NOR flash memory.

In order to achieve the above object, following technical solutions are provided.

According to one aspect of the present disclosure, a method for manufacturing the NOR flash memory is provided, which includes:

providing a gate stack structure comprising a floating gate and configured to form the NOR flash memory, the gate stack structure comprising a tunneling dielectric layer, a first polysilicon layer, an inter-poly layer dielectric, a second polysilicon layer, which are sequentially laminated from low to up;

forming a mask dielectric layer on the second polysilicon layer;

etching patternedly part of the mask dielectric layer to expose part of the second polysilicon layer which is close to the source of the NOR flash memory; and self aligning an exposed second polysilicon layer to form a metal silicide layer.

According to one embodiment, in the NOR flash memory, two symmetric flash memory units share a source to form a common source.

According to one embodiment, part of the mask dielectric layer is etched when a corresponding dielectric layer on the common source of the NOR flash memory is etched.

According to one embodiment, an inclined surface is formed on the exposed second polysilicon layer.

According to one embodiment, after the metal silicide layer is formed, the method further comprising:

forming an isolating layer covering a gate;

forming a barrier layer of an interlayer dielectric;

forming an interlayer dielectric on the barrier layer;

flattening the interlayer dielectric; and patterning to form a drain contacting hole leading out a drain electrode.

According to one embodiment, the thickness of the mask dielectric layer is in the range of from 30 nm to 100 nm.

According to one embodiment, the mask dielectric layer is made of silica.

According to one embodiment, the etching is an anisotropic etching.

According to one embodiment, the metal silicide is cobalt silicide or tungsten silicide.

According to one embodiment, a 0.13 µm or less technology is used in the method.

According to another aspect, a NOR flash memory manufactured according to the above method is provided, the NOR flash memory includes unetched mask dielectric layer, the unetched mask dielectric layer is substantially located between a metal silicide layer and a drain contacting hole of the NOR flash memory.

According to one embodiment, the thickness of the unetched mask dielectric layer is in the range of from 30 nm to 100 nm.

According to one embodiment, a critical dimension of the NOR flash memory is 0.18 µm or less.

Technical effects of the present disclosure are: a mask dielectric layer is formed and partially etched to expose part of the second polysilicon layer, thus a relative position between the metal silicide layer and the drain contacting hole can be defined, the unetched mask dielectric layer is substantially located between the metal silicide layer and the drain contacting hole of the NOR flash memory, thus, it is advantageous to decrease the drain current between the gate electrode and the drain electrode, especially the drain current in the erasing process. Moreover, the above manufacturing process is not complex, a process window is large, and a side effect is small, which are advantageous to large scale production.

BRIEF DESCRIPTION OF THE DRAWINGS

These and other objects, advantages, purposes and features will become apparent upon review of the following specification in conjunction with the drawings, wherein identical or similar elements are denoted by identical reference numerals.

DETAILED DESCRIPTION OF THE EMBODIMENTS

Some of many possible embodiments of the invention will be described hereinafter in order to provide a basic understanding of the invention. It is not intended to identify critical or crucial elements of the invention or define the scope of protection. It is apparent to those skilled in the art that a variety of modifications and changes may be made without departing from the scope of the present invention, which is intended to be defined by the appended claims. Embodiments and figures below are only exemplary descriptions of the technical solutions of the present disclosure, which cannot be understood as the whole of the present disclosure, or which cannot limit or define the technical solutions of the present disclosure.

In the figures, for the sake of clarity, the thickness of the layer and the area are much larger than that in the actual situation. Characteristics of rounded shapes caused by etching are not shown in the figures.

In the present disclosure, direction terms (e. g. 'up', 'low' etc.) and the like are used to describe directions in the figures, or directions which can be understood by those skilled in the field. In the embodiments, a direction parallel to the direction of the channel between the source (S) and the drain (D) of the NOR flash memory is defined as the direction of Y axis, a direction perpendicular to the surface of the silicon surface is defined as the direction of Z axis.

Figure 1:
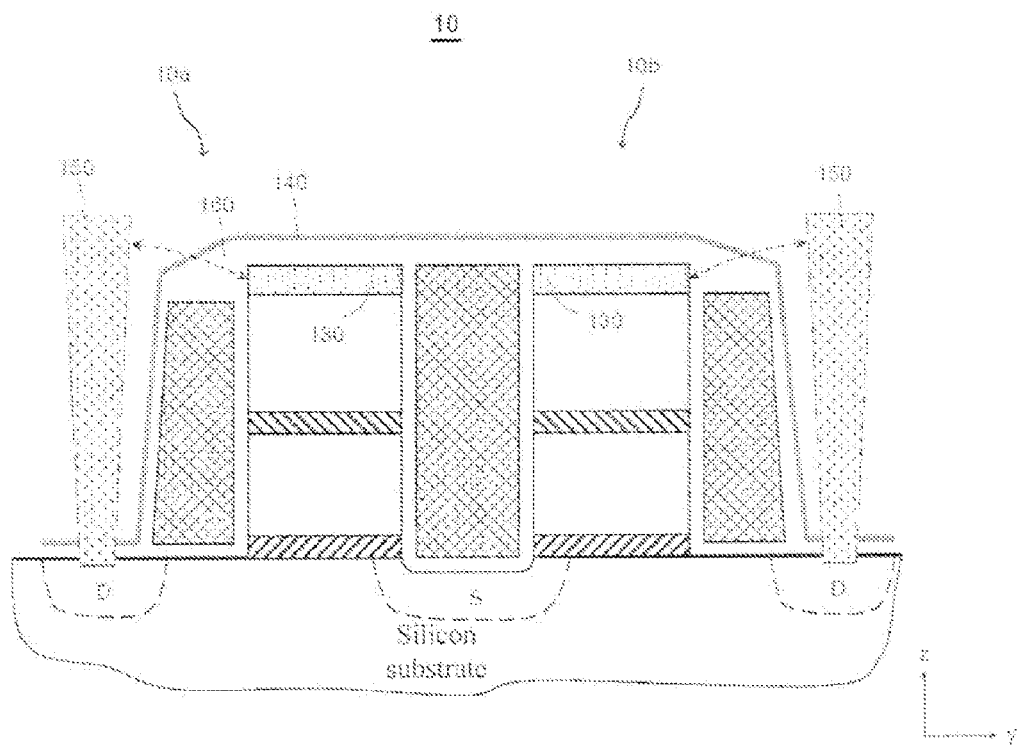
FIG. 1 is a schematic view of a conventional NOR flash memory.

In order to decrease a drain current between the gate electrode and the drain electrode shown in FIG. 1, a first method is to use an etching method with etching selectivity to etch a drain contacting hole, thus a side etching effect of an ILD barrier layer can be reduced, and the thickness of the ILD barrier layer 140 will not decrease. A second method is to increase the thickness of the ILD barrier layer 140. A third method is to decrease position errors between the floating gate and the drain contacting hole, and decrease a thickness drift of an isolating layer between the floating gate and the drain. However, the above methods for decreasing drain current have side effect (e.g., it can lead to stress induced leakage), which is not conducive to mass production of the NOR flash memory.

Figure 5:
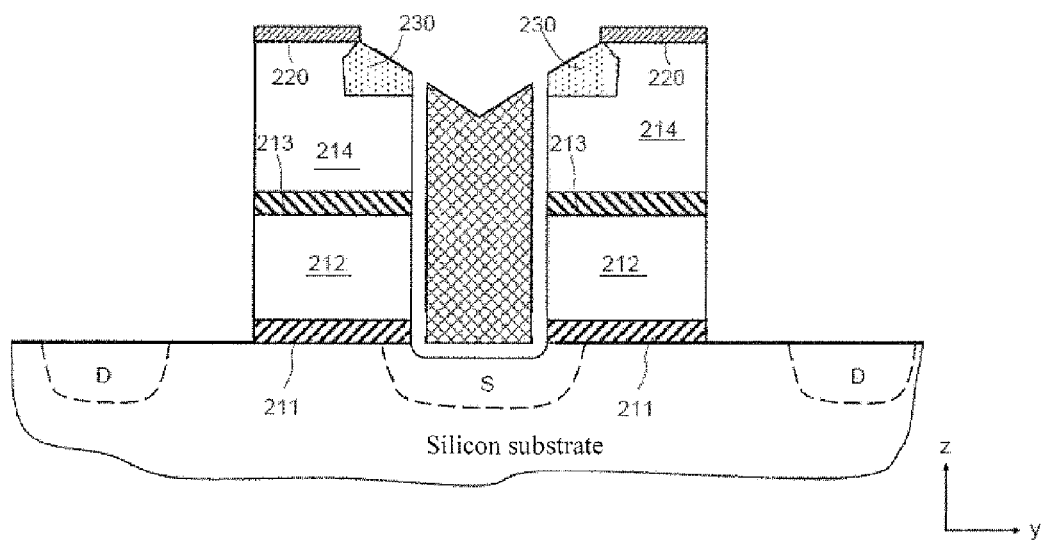
Figure 6:
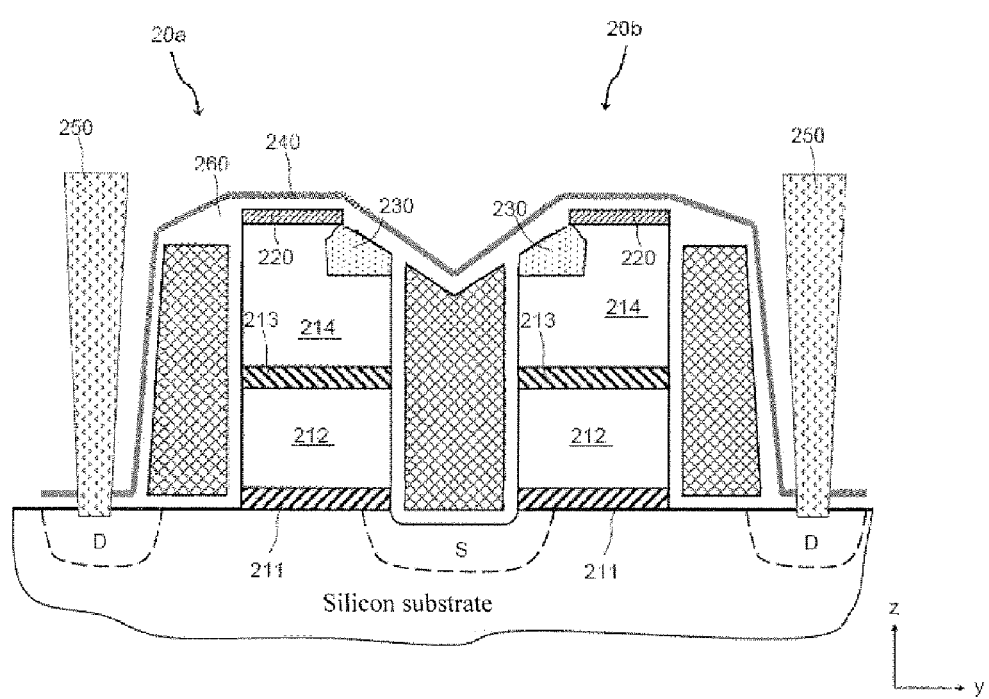
FIG. 6 is a schematic view of the NOR flash memory according to an embodiment of the disclosure.

FIG. 6 is a schematic view of the NOR flash memory according to one embodiment. FIGS. 2 to 5 show a manufacturing method of the NOR flash memory shown in FIG. 6. The method of manufacturing the NOR flash memory is described more fully with reference to FIGS. 2 to 6.

Figure 2:
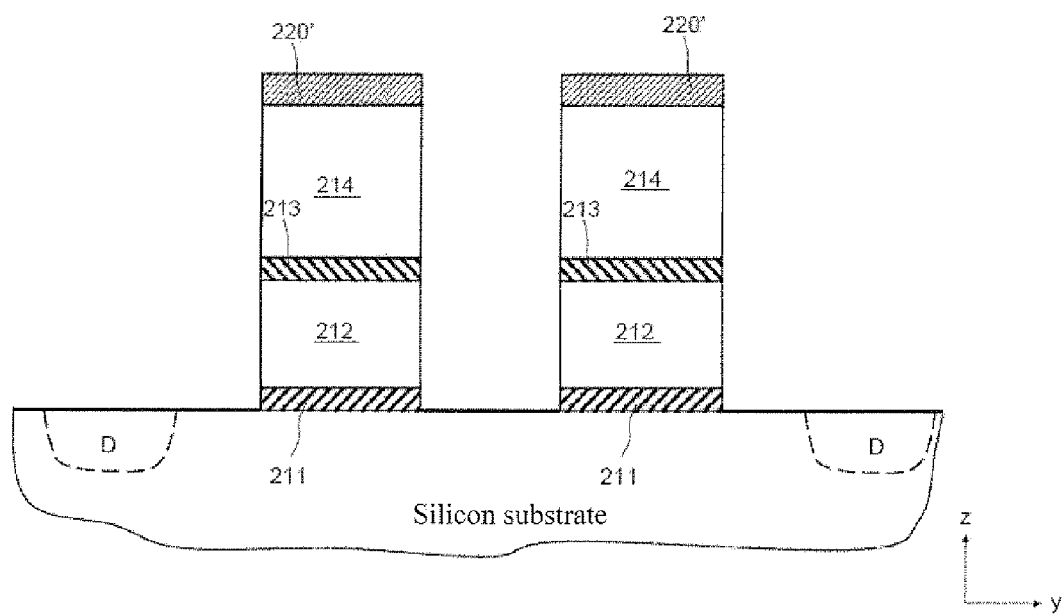
FIGS. 2 to 5 show a manufacturing process of the NOR flash memory shown in FIG. 6 according to one embodiment.

First, referring to FIG. 2, a gate stack structure configured to form the NOR flash memory is provided, the gate stack structure includes the floating gate. The gate stack structure includes a tunneling dielectric layer 211, a first polysilicon layer 212, an inter-poly layer dielectric (IPD) 213, a second polysilicon layer 214, a mask dielectric layer 220" formed by patterning the second polysilicon layer 214, which are sequentially laminated from low to up (along the direction of Z axis). In the illustrated embodiment, the NOR flash memory has a common source, the mask dielectric layer 220" is patterned synchronously when the tunneling dielectric layer 211, the first polysilicon layer 212, the IPD 213, the second polysilicon layer 214 are patterned and etched, thus the mask dielectric layer 220" is formed on the second polysilicon layer 214 with alignment. Generally, the first polysilicon layer 212 is configured to store electrons to form the floating gate, the second polysilicon layer 214 is configured to form the gate electrode of the NOR flash memory. The sizes of the tunneling dielectric layer 211, the first polysilicon layer 212, the IPD 213, and the second polysilicon layer 214 can be varied without limiting.

In the illustrated embodiment, the mask dielectric layer 220" can be made of insulating dielectric material, such as silica, and specific manufacturing processes of the mask dielectric layer 220" are not limited. When the mask dielectric layer 220" is made of silica, it can be manufactured by different processes, such as LPTEOS (Low-Pressure Tetraethylorthosilicate), PETEOS (Plasma Enhanced Tetraethylorthosilicate), HTO (high temperature silicon oxide), ISSG (In-Situ Steam Generation). The thickness of the mask dielectric layer 220" can be varied from 30 nm to 100 nm, for example, the thickness of the mask dielectric layer 220" is 45 nm. When configuring the thickness of the mask dielectric layer 220", an affection of other etching processes to the thickness of the metal silicide layer 230 should be considered, after the metal silicide layer 230 (referring to FIG. 5) is formed. It should be assured that the mask dielectric layer 220 is partially retained on the second polysilicon layer 214 to form continuous dielectric film.

Figure 3:
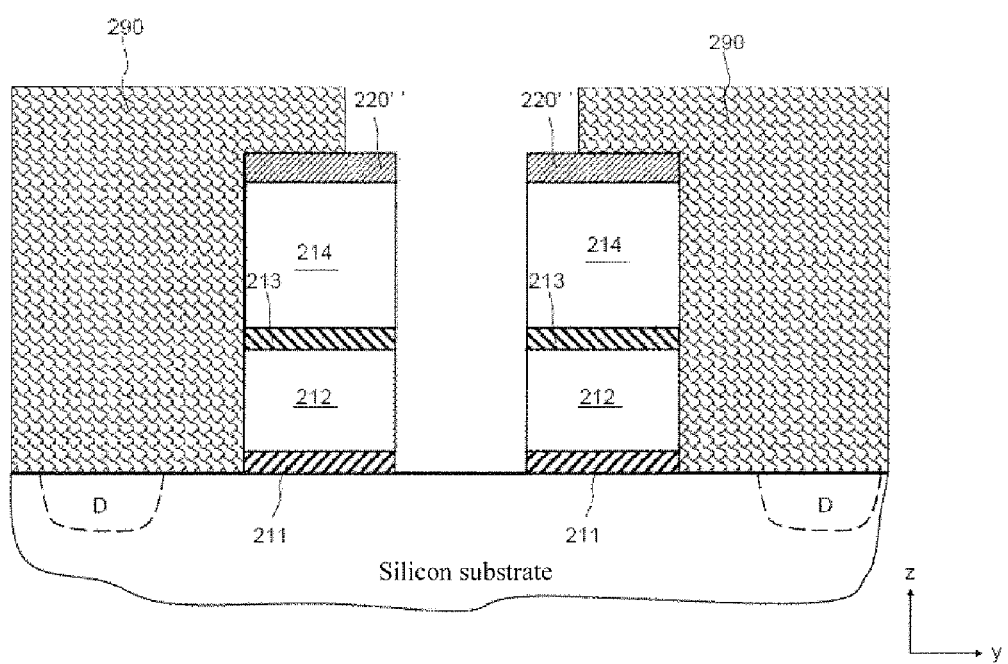

Furthermore, referring to FIG. 3, a photoresist layer 290 is formed, and the mask dielectric layer 220" is ready to be etched patternedly. In the above step, part of the mask dielectric layer 220" to be etched is defined, position of exposed part of the of the second polysilicon layer is defined, thus positions between the remaining part of the mask dielectric layer and the metal silicide layer formed based on the self alignment of the exposed second polysilicon layer can be determined.

Referring to FIG. 3, in the mask dielectric layer 220", part of the second polysilicon layer which is close to the common source (i.e. away from drain contacting hole) is exposed through the photoresist layer 290. An area of the second polysilicon layer exposed through the photoresist layer 290 is about 50% of the area of the second polysilicon layer 214.

Figure 4:
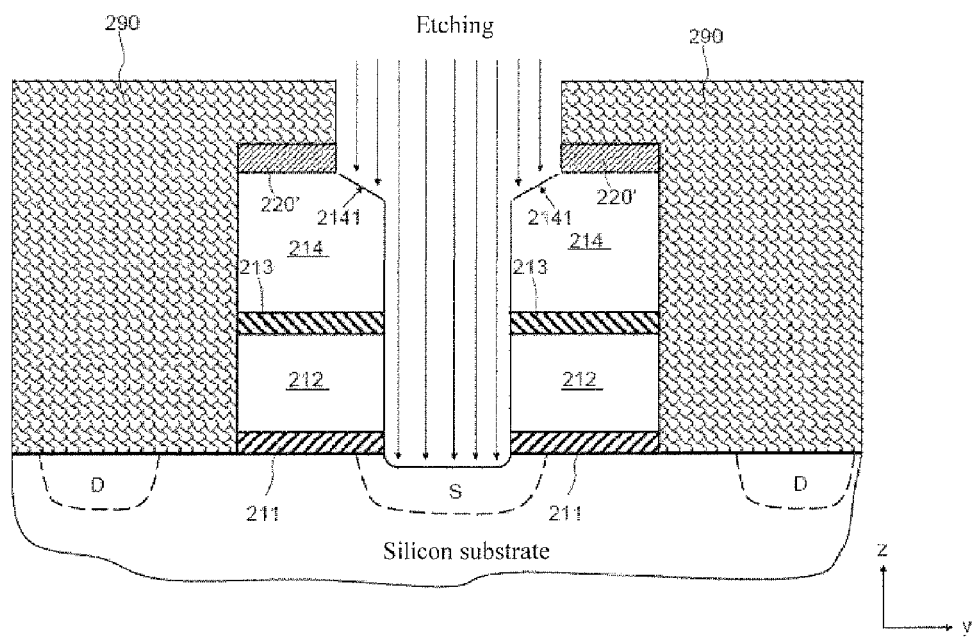

Furthermore, referring to FIG. 4, the mask dielectric layer 220" is etched using the photoresist layer 290 as a mask. Part of the mask dielectric layer 220" is removed to form the mask dielectric layer 220'. In the illustrated embodiment, when the mask dielectric layer 220" is etched, a dielectric layer corresponded to the common source (S) is etched synchronously to expose the silicon substrate of the source, the exposed substrate is ready to be doped to form the source. Thus, the mask dielectric layer 220" is etched synchronously with the etching of the common source. Preferably, an anisotropic etching method (e.g. reactive ion etching) is used to improve the etching conformality.

In the illustrated embodiment, the mask dielectric layer is etched to expose part of the second polysilicon layer, the exposed part of the second polysilicon layer will be etched synchronously, thus an inclined surface of the second polysilicon layer shown in FIG. 4 is formed, an end of an inclined surface 2141 which is close to the mask dielectric layer is higher than the end which is close to the common source.

Furthermore, referring to FIG. 5, the exposed second polysilicon layer is self aligned to form the metal silicide layer 230. Specifically, in the illustrated embodiment, a metal layer is deposited on the inclined surface 2141, then a metal silicide layer 230 is formed, the metal silicide layer is formed on a side of the gate which is close to the common source. The metal silicide layer 230 can be made of CoSi (cobalt silicide) or WSi (tungsten silicide), etc. The metal silicide layer 230 is configured to form a gate electrode of the gate, in an erasing process of the formed NOR flash memory, a higher voltage is biased to the metal silicide layer 230, then the voltage is worked on the floating gate.

Furthermore, referring to FIG. 6, an isolating layer 260 and an ILD barrier layer 240 covering the gate are formed, the ILD is formed and flattened, the drain contacting hole 250 of the drain electrode is formed by patterning. It should be noted that, in the above processes, the above etching process may etch the mask dielectric layer 220', thus the mask dielectric layer 220' is further thinned to form the mask dielectric layer 220. The mask dielectric layer 220 (i.e. the unetched mask dielectric layer) retained in the NOR flash memory can effectively increase electric isolation between the metal silicide layer 230 and the drain contacting hole 250, thus drain current between the metal silicide layer 230 and the drain contacting hole 250 can be reduced.

At this point, the NOR flash memory 20 shown in FIG. 6 is substantially formed. Referring to FIG. 6, NOR flash memory units 20a and 20b in the NOR flash memory 20 are symmetrical units and share a common source. In each NOR flash memory unit, the mask dielectric layer 220 is approximately located between the metal silicide layer 230 and the drain contacting hole 250, thus the mask dielectric layer 220 can have a good insulating effect. In the illustrated embodiment, the mask dielectric layer 220 is thinner than the mask dielectric layer 220", the thickness of the mask dielectric layer 220 is in the range of from 30 nm to 100 nm, for example, the thickness of the mask dielectric layer 220 is about 20 nm.

In the method of manufacturing the NOR flash memory shown in FIGS. 2 to 6, the role of the mask oxide layer in forming of the metal silicide layer 230 through patterning and position relation among the mask oxide layer, the metal silicide layer 230, and the drain contacting hole 250 are utilized, the drain current between the gate electrode and the drain electrode of the NOR flash memory can be reduced. Moreover, the above manufacturing process is not complex compared to the manufacturing process of the NOR flash memory of the prior art, a manufacturing process window is large (in the above third method, a position accuracy requirement are relatively low), a side effect is small, the above manufacturing process is advantageous to large scale production.

It should be noted that, the above manufacturing method is appropriate to manufacture the NOR flash memory with a critical dimension of less than or equal to 0.18 μm, the drain current of the NOR flash memory can be reduced compared to the conventional NOR flash memory.

Although the present invention has been described with reference to the embodiments thereof and the best modes for carrying out the present invention, it is apparent to those skilled in the art that a variety of modifications and changes may be made without departing from the scope of the present invention, which is intended to be defined by the appended claims.

What is claimed is:

1. A method of manufacturing a NOR flash memory having a substrate, comprising the following steps:
   providing a gate stack structure configured to form the NOR flash memory, the gate stack structure comprising a tunneling dielectric layer, a first polysilicon layer, an inter-poly layer dielectric, a second polysilicon layer having a surface inclined at a non-zero angle relative to the first polysilicon layer, which are sequentially laminated from low to up;
   forming a mask dielectric layer on the second polysilicon layer;
   etching patternedly part of the mask dielectric layer to expose part of the second polysilicon layer which is close to a source of the NOR flash memory; and
   self aligning the part of second polysilicon layer exposed during the etching to form a metal silicide layer;
   wherein the entire top surface of the first polysilicon layer is horizontal relative to the substrate; and
   wherein a portion of the top surface of the second polysilicon layer is inclined relative to the substrate.

2. The method according to claim 1, wherein in the NOR flash memory, two symmetric flash memory units share a source to form a common source.

3. The method according to claim 2, wherein part of the mask dielectric layer is etched when a corresponding dielectric layer on the common source of the NOR flash memory is etched.

4. The method according to claim 3, wherein the thickness of the mask dielectric layer is in the range of from 30 nm to 100 nm.

5. The method according to claim 3, wherein the etching is an anisotropic etching.

6. The method according to claim 3, wherein the metal silicide is cobalt silicide or tungsten silicide.

7. The method according to claim 1, wherein after the metal silicide layer is formed, the method further comprises:
   forming a barrier layer of an interlayer dielectric;
   forming an interlayer dielectric on the barrier layer;
   flattening the interlayer dielectric; and
   patterning to form a drain contacting hole leading out a drain electrode.

8. The method according to claim 1, wherein the thickness of the mask dielectric layer is in the range of from 30 nm to 100 nm.

9. The method according to claim 1, wherein the mask dielectric layer is made of silica.

10. The method according to claim 1, wherein the etching is an anisotropic etching.

11. The method according to claim 1, wherein the metal silicide is cobalt silicide or tungsten silicide.

12. The method according to claim 1, wherein a 0.13 μm or less technology is used in the method.

13. A NOR flash memory manufactured according to the method of claim 1, wherein the NOR flash memory comprises an unetched mask dielectric layer, the unetched mask dielectric layer is substantially located between a metal silicide layer and a drain contacting hole of the NOR flash memory.

14. The NOR flash memory according to claim 13, wherein the thickness of the unetched mask dielectric layer is in the range of from 30 nm to 100 nm.

15. The NOR flash memory according to claim 13, wherein a critical dimension of the NOR flash memory is 0.18 μm or less.

16. The method of claim 1, wherein a portion of the top surface of the first polysilicon layer is horizontal, and a portion of the top surface of the second polysilicon layer directly above the first portion of the top surface of the first polysilicon layer is non-horizontal.

* * * * *